(12) United States Patent
Summers

(10) Patent No.: US 6,972,371 B2
(45) Date of Patent: Dec. 6, 2005

(54) POTTING CRACK SHIELD AND RELATED METHOD

(75) Inventor: Sean Kelly Summers, Carson City, NV (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/648,351

(22) Filed: Aug. 27, 2003

(65) Prior Publication Data

US 2005/0045377 A1    Mar. 3, 2005

(51) Int. Cl.[7] .............................................. H05K 5/06
(52) U.S. Cl. ................................ 174/52.2; 174/52.5
(58) Field of Search ........................... 174/52.5, 52.2; 257/787

(56) References Cited

U.S. PATENT DOCUMENTS

| | | | |
|---|---|---|---|
| 5,877,545 A | 3/1999 | Prince et al. | ................ 257/679 |
| 6,566,596 B1 * | 5/2003 | Askew | ................ 174/35 MS |

* cited by examiner

Primary Examiner—Hung V. Ngo
(74) Attorney, Agent, or Firm—Nixon & Vanderhye P.C.

(57) ABSTRACT

An electronic component includes a circuit board assembly having a thin polymer sheet having no electronic function located within the assembly, the circuit board assembly and the thin polymer sheet encapsulated in a potting material. A method of preventing damage to circuit boards in an electronic component encapsulated in potting material due to cracks in the potting material includes a) providing plural circuit boards for assembly into the component; b) during assembly, inserting a thin polymer film at least between adjacent ones of the plural circuit boards, said polymer film having no electronic function; c) completing the assembly of the component; and d) encapsulating the component in a potting material.

17 Claims, 5 Drawing Sheets

POTTING CRACK SHIELD AND RELATED METHOD

This invention relates to the manufacture of electronic equipment and, more specifically, to the encapsulation of circuit board components in potting material, and to the prevention of damage to the circuit board components upon the occurrence of stress cracks in the potting material.

BACKGROUND OF THE INVENTION

Printed circuit boards are typically constructed of glass laminate boards clad with a conductive layer enabling the formation of a printed circuit by conventional photo-resist coating and photographic techniques. Component leads and/or connectors are typically soldered or otherwise connected to the boards. Circuit boards are often grouped together as part of an assembly and then encapsulated in a potting material. The potting compound is designed to distribute external forces and pressures experienced by the assembly. On the other hand, in the event the potting material itself cracks, forces are transmitted to the circuit board(s) that may damage the board(s). It has been proposed that by reinforcing the potting material, the formation of large cracks would be drastically reduced. Different methods of reinforcement, from tiny glass beads suspended in the potting material to various fiber matrix material layers placed above susceptible circuit boards, have been tried but have not been completely successful. While in some instances the size of the cracks have been reduced somewhat by these techniques, some cracks nevertheless still have enough energy to damage the circuit board components. In addition, from a manufacturing standpoint, the glass bead reinforced potting material tends to "settle" and the resulting mix is not homogeneous.

BRIEF DESCRIPTION OF THE INVENTION

In the exemplary embodiment of the present invention, a potting crack shield has been developed for an electronics component that prevents stress cracks associated with larger volumes of potting material from damaging the encapsulated circuit board. More specifically, the crack shield is comprised of a thin piece of Teflon® film that is configured and strategically placed within the circuit board grouping during assembly, and prior to potting. The Teflon® film has no electronic function but acts as a safe path for cracks to form along, and to follow, without sacrificing the functionality of either the potting material or the circuit board(s). In other words, the Teflon® film acts as the path of least resistance for the crack or cracks. Moreover, potting material does not adhere to the surface of the Teflon® film. As a result, the crack shield "appears" to the crack as simply a large void in the potting matrix. The edges of this void present large stress concentrations in safe locations which, when fractured, serve as a stress relief for the system.

Accordingly, in its broader aspects, the present invention relates to an electronic component comprising a circuit board assembly having a thin polymer sheet having no electronic function located within the assembly, the circuit board assembly and the thin polymer sheet encapsulated in a potting material.

In another aspect, the invention relates to an electronic component comprising circuit board grouping including a connector board secured to one side of a main board and a pair of signal conditioning boards engaged with an opposite side of the main board, the pair of signal conditioning boards substantially parallel to each other and substantially perpendicular to the main board; and a thin sheet of polymer material folded to provide back-to-back face portions and a pair of free end portions extending generally away from the face portions, wherein the thin sheet is inserted into the component such that the back-to-back face portions are located between the pair of signal conditioning boards and the pair of free end portions extend in substantially opposite directions away from the face portions, between the main board and the signal conditioning boards.

In still another aspect, the invention relates to method of preventing damage to circuit boards in an electronic component encapsulated in potting material due to cracks in the potting material comprising: a) providing plural circuit boards for assembly into the component; b) during assembly, inserting a thin polymer film at least between adjacent ones of the plural circuit boards, the polymer film having no electronic function; c) completing the assembly of the component; and d) encapsulating the component in a potting material.

DETAILED DESCRIPTION OF THE INVENTION

Figure 1:
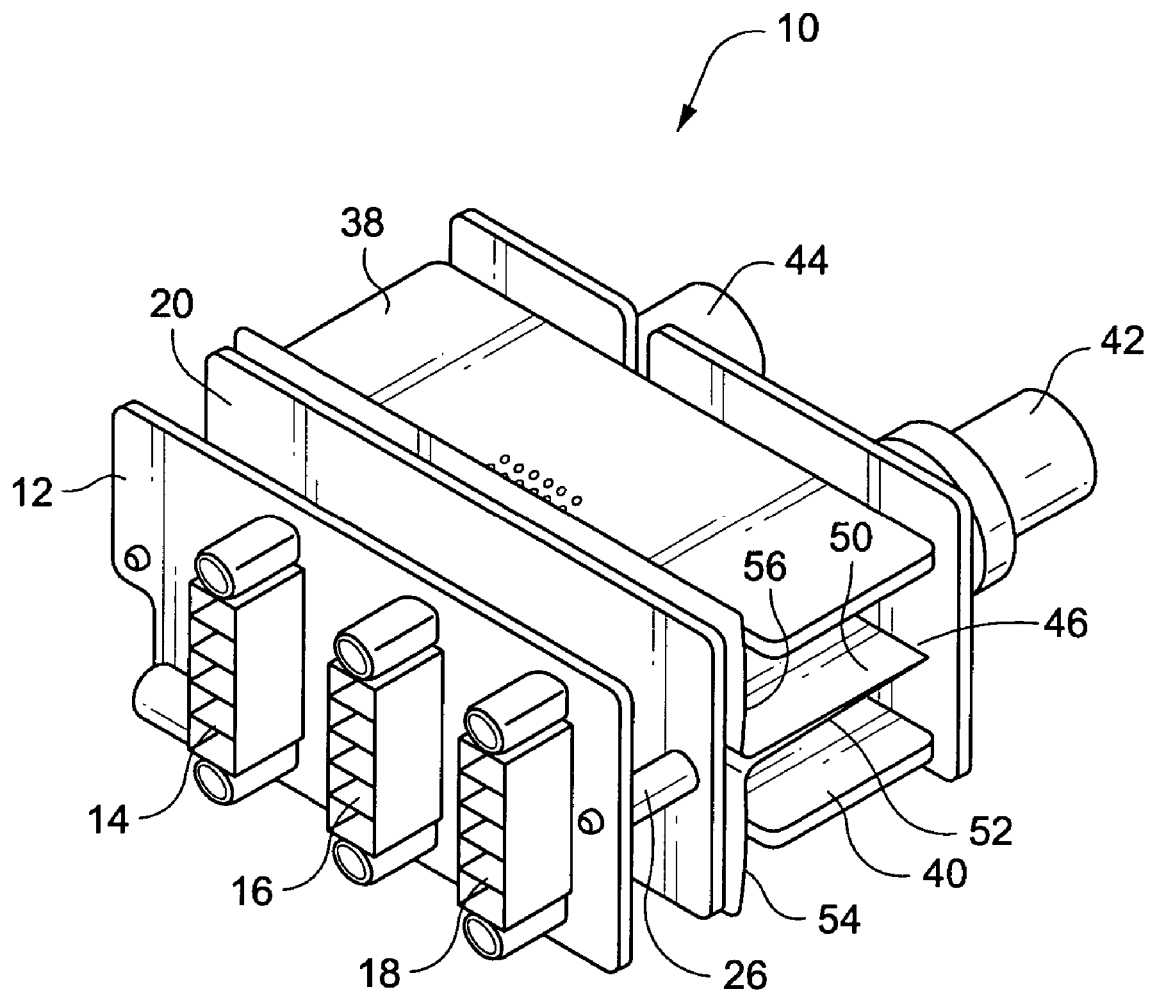
FIG. 1 is a front right perspective view of an assembled circuit board component incorporating the potting crack shield in accordance with an exemplary embodiment of the invention.
Figure 2:
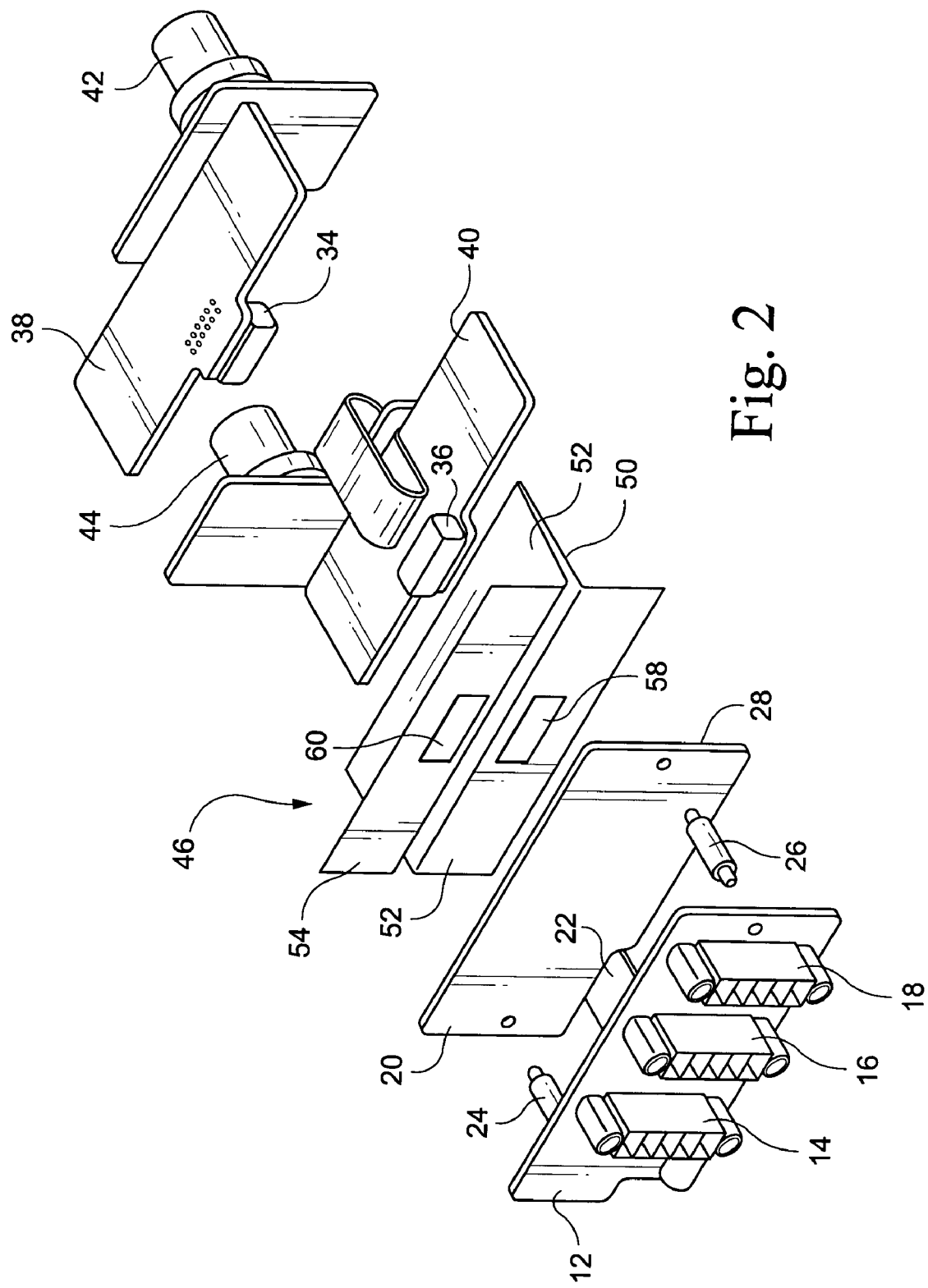
FIG. 2 is a front right exploded perspective view of the component shown in FIG. 1.
Figure 3:
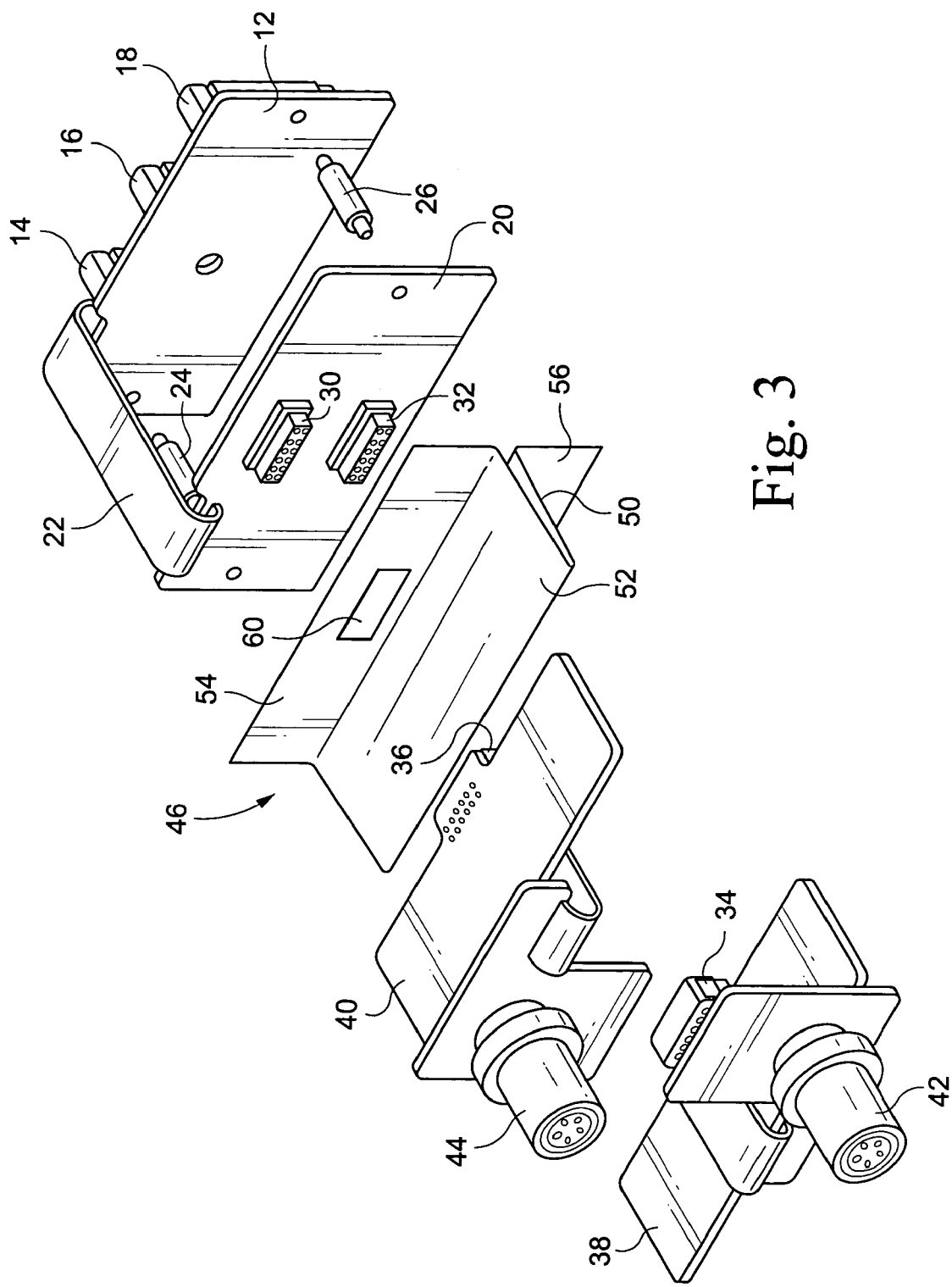
FIG. 3 is a rear left exploded perspective view of the device shown in FIG. 1.

In the exemplary embodiment, and with reference to FIGS. 1–3, the electronic component 10 is a circuit board grouping in the form of a transducer interface module or the like. More specifically, the component 10 includes a connector board 12 with three sockets 14, 16 and 18. The connector board 12 is electrically connected to the main board 20 via a flexible ribbon connector 22 (FIGS. 2 and 3), but is spaced from the board by relatively rigid standoff pins 24, 26. The back side 28 of the main board 20 is provided with a pair of channel connectors 30, 32 that receive complementary connectors 34, 36 on essentially mirror image signal conditioning boards 38, 40, respectively. Cable connector sockets 42, 44 project from the opposite side of the boards 38, 40. In a typical transducer interface module, signals are input to the module via cable sockets 38 and 40 and are output to, for example, a monitor via connectors 14, 16 and 18.

Figure 5:
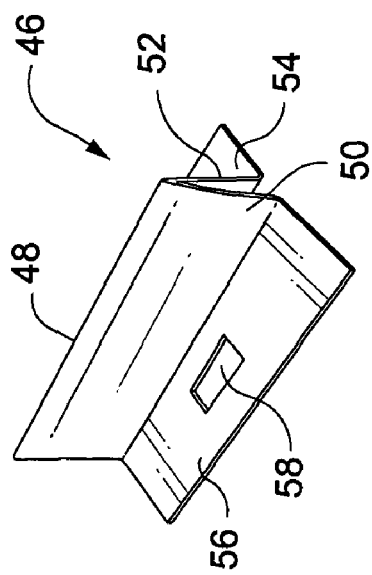
FIG. 5 is a perspective view of the crack shield of FIG. 4 but folded into its final shape.
Figure 4:
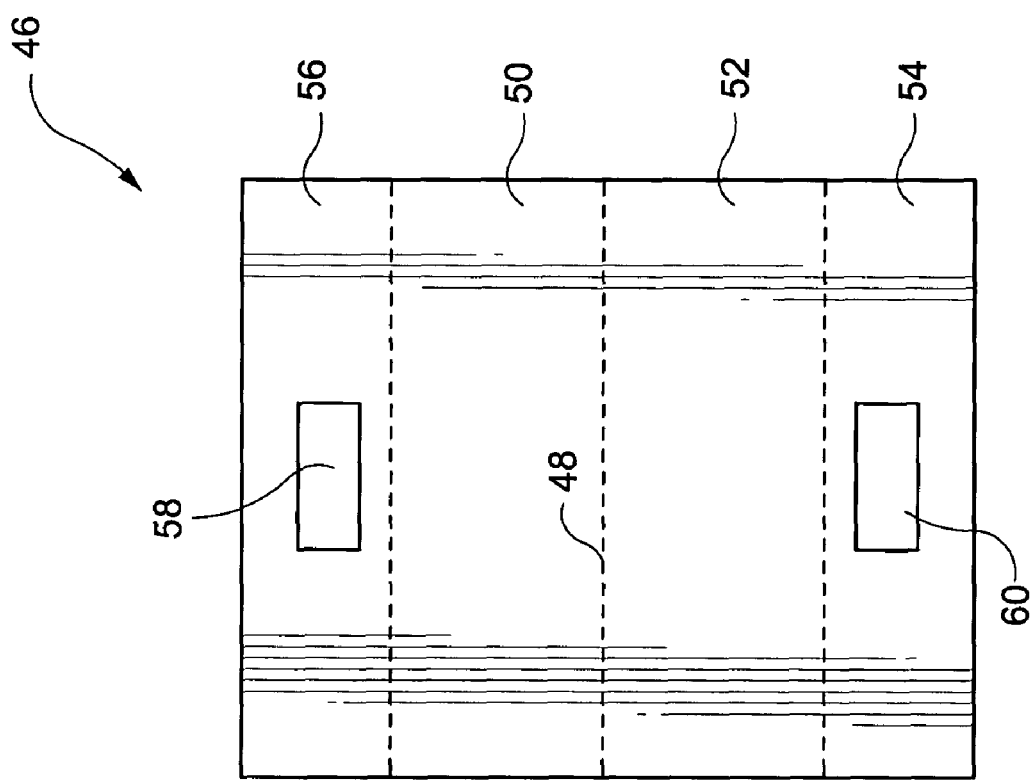
FIG. 4 is a plan view of the potting crack shield in accordance with the exemplary embodiment of the invention prior to folding.
Figure 6:
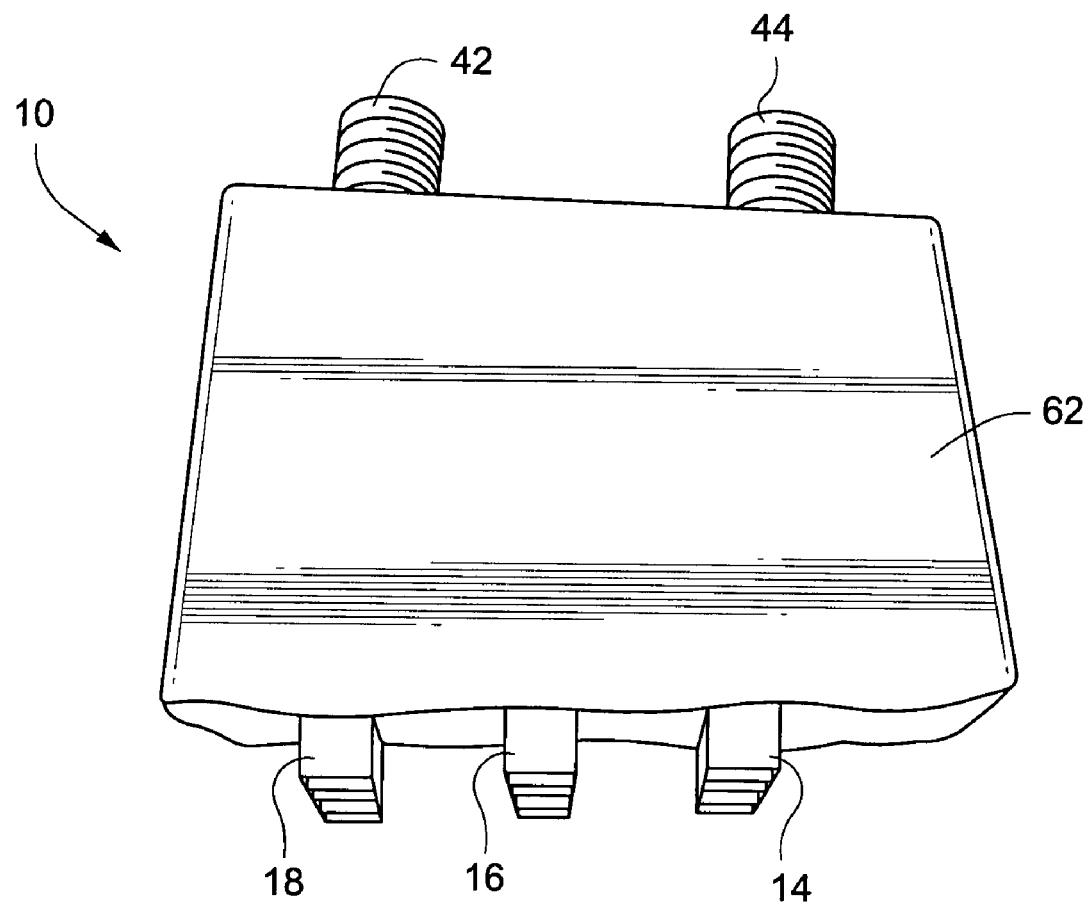
FIG. 6 is a side perspective view of the circuit board component of FIG. 1 encapsulated in a potting compound.

In accordance with the exemplary embodiment of this invention, and with further reference to FIGS. 4 and 5, a crack shield 46 is relatively loosely inserted between the signal conditioning boards 38, 40 as further described hereinbelow. Specifically, the crack shield 46 is composed of a polytetrafluoroethylene film or tape, preferably Teflon®. A relatively wide strip of the film (i.e., sufficiently wide to span the width of the component) is doubled over on itself about fold line 48 such that two face portions 50, 52 of the film are substantially back-to-back. The lower or free end portions 54, 56 of the film are bent outwardly at an angle of about 90°, recognizing, however, that when inserted, the angle may be less than 90° due to the tendency of face portions 50, 52 to separate as best seen in FIGS. 3 and 5. During assembly, the crack shield is inserted into the component such that face portions 50, 52 lie between the signal conditioning boards 38, 40 and generally parallel thereto, with free end portions 54, 56 extending in opposite directions adjacent and along the main board 20, between the main board 20 and the signal conditioning boards 38, 40. Rectangular apertures or openings 58, 60 in the lower or free end portions 54, 56 permit engagement of the connectors 30, 32 on the main board 20 and connectors 36, 34 on the signal conditioning boards 38, 40 during assembly of the component. At the same time, the connectors 30, 32 projecting through apertures 58, 60 hold the crack shield in place prior to and during potting. Upon assembly as shown in FIG. 1, the component 10 is encapsulated in a suitable potting material 62 (see FIG. 6). The potting material is preferably a two-part epoxy resin that cures to a rigid state. One suitable composition is resin 20-3060 commercially available from Epoxies Etc. Because the Teflon® crack shield does not adhere to the potting material, the space taken up by the shield 46 "appears" simply as a large void to the potting material, and the crack shield provides a path of least resistance to any cracks that may form in the potting material 62.

It will be appreciated that the crack shield 46 as described herein has been tailored for the transducer interface module 10. Other components have different configurations and the crack shield may be shaped accordingly. For example, in some circumstances, only a two-dimensional configuration may be required. The size and thickness of the crack shield may also vary. Tape or film thicknesses from 0.015 to 0.030 in. may be appropriate, depending on the final configuration of the crack shield and other manufacturing conditions.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An electronic component comprising a circuit board assembly having a thin polymer sheet having no electronic function located within said assembly, said circuit board assembly and said thin polymer sheet encapsulated in a potting material; wherein said circuit board assembly comprises two signal conditioning boards arranged substantially perpendicularly to a main circuit board, and wherein portions of said thin polymer sheet are located between said pair of conditioning boards, and other portions of said thin polymer sheet are located between said main board and said pair of conditioning boards.

2. An electronic component comprising a circuit board assembly having a thin polymer sheet having no electronic function located within said assembly, said circuit board assembly and said thin polymer sheet encapsulated in a potting material; wherein said thin polymer sheet is folded over itself to form back-to-back face portions and further wherein free end portions of said thin polymer sheets are folded so as to extend away from said face portions.

3. The electronic component of claim 2 wherein said thin polymer sheet is formed with apertures in said end portions that are adapted to permit board connectors to pass therethrough.

4. An electronic component comprising a circuit board grouping including a connector board secured to one side of a main board and a pair of signal conditioning boards engaged with an opposite side of said main board, said pair of signal conditioning boards substantially parallel to each other and substantially perpendicular to said main board; and a thin sheet of polymer material folded to provide back-to-back face portions and a pair of free end portions extending generally away from said face portions, wherein said thin sheet is inserted into the component such that said back-to-back face portions are located between said pair of signal conditioning boards and said pair of free end portions extend in substantially opposite directions away from said face portions, between said main board and said signal conditioning boards.

5. The circuit board grouping of claim 4 wherein said thin sheet is formed with a pair of apertures in said free end portions for permitting connectors on said signal conditioning boards to be arranged with connectors 30, 32 on said main board.

6. The circuit board grouping of claim 4 wherein said thin polymer sheet comprises polytetrafluoroethylene.

7. The circuit board grouping of claim 6 wherein said thin polymer sheet has a thickness of from about 0.015 in. to about 0.030 in.

8. The circuit board grouping of claim 7 wherein said thin polymer sheet has a thickness of 0.015 in.

9. The circuit board grouping of claim 4 wherein said thin polymer sheet has a thickness of from about 0.015 to about 0.030 in.

10. The circuit board grouping of claim 4 wherein said circuit board grouping comprises a transducer interface module.

11. A method of preventing damage to circuit boards in an electronic component encapsulated in potting material due to cracks in the potting material comprising:
   a) providing plural circuit boards for assembly into the component;
   b) during assembly, inserting a thin polymer film at least between adjacent ones of said plural circuit boards, said polymer film having no electronic function;
   c) completing the assembly of the component; and
   d) encapsulating the component in a potting material.

12. The method of claim 11 wherein said plural circuit boards comprise a connector board secured to one side of a main board and a pair of signal conditioning boards plugged into an opposite side of said main board, said pair of signal conditioning boards substantially parallel to each other and substantially perpendicular to said main board, and wherein during step b), the thin polymer film is inserted between said pair of signal conditioning boards.

13. The method of claim 12 wherein said thin sheet is formed with a pair of apertures for permitting said signal conditioning boards to be plugged into said main board.

14. The method of claim 12 wherein said thin polymer sheet comprises polytetrafluoroethylene.

15. The method of claim 12 wherein said thin polymer sheet has a thickness of from about 0.015 to about 0.030 in.

16. The method of claim 12 wherein prior to step b), said thin polymer film is folded over itself to form back-to-back face portions, and free end portions are folded so as to extend away from said face portions.

17. The method of claim 16 wherein, during step b), said face portions are inserted between said signal conditioning boards and said free end portions are arranged to extend generally parallel to said main board and generally perpendicular to said face portions.

* * * * *

UNITED STATES PATENT AND TRADEMARK OFFICE
CERTIFICATE OF CORRECTION

| | |
|---|---|
| PATENT NO. | : 6,972,371 B2 |
| APPLICATION NO. | : 10/648351 |
| DATED | : December 6, 2005 |
| INVENTOR(S) | : Sean Kelly Summers |

Page 1 of 1

It is certified that error appears in the above-identified patent and that said Letters Patent is hereby corrected as shown below:

In the Claims:

Claim 3, line 3 delete "board" and insert --channel--.

Claim 13, line 1 delete "sheet" and insert --film--.

Claim 14, line 2 delete "sheet" and insert --film--.

Claim 15, line 2 delete "sheet" and insert --film--.

Signed and Sealed this

Eighth Day of January, 2008

JON W. DUDAS
*Director of the United States Patent and Trademark Office*